United States Patent
Rakshit et al.

(10) Patent No.: US 8,120,073 B2
(45) Date of Patent: Feb. 21, 2012

(54) TRIGATE TRANSISTOR HAVING EXTENDED METAL GATE ELECTRODE

(75) Inventors: Titash Rakshit, Hillsboro, OR (US); Stephen M. Cea, Hillsboro, OR (US); Jack T Kavalieros, Portland, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 319 days.

(21) Appl. No.: 12/317,966

(22) Filed: Dec. 31, 2008

(65) Prior Publication Data

US 2010/0163970 A1    Jul. 1, 2010

(51) Int. Cl.
*H01L 29/06* (2006.01)
*H01L 29/08* (2006.01)

(52) U.S. Cl. ........ 257/288; 257/349; 257/623; 257/626; 257/E29.022; 257/E29.04

(58) Field of Classification Search .................. 257/288, 257/349, 623, 626, E29.022, E29.04
See application file for complete search history.

(56) References Cited

U.S. PATENT DOCUMENTS

| | | | | |
|---|---|---|---|---|
| 7,148,541 B2 * | 12/2006 | Park et al. | ...... | 257/347 |
| 7,394,117 B2 * | 7/2008 | Jung et al. | ...... | 257/213 |
| 7,402,856 B2 * | 7/2008 | Brask et al. | ...... | 257/288 |
| 7,863,658 B2 * | 1/2011 | Ho et al. | ...... | 257/288 |
| 2005/0250285 A1 * | 11/2005 | Yoon et al. | ...... | 438/283 |
| 2007/0272954 A1 * | 11/2007 | Chen et al. | ...... | 257/288 |
| 2008/0315309 A1 * | 12/2008 | Chang et al. | ...... | 257/346 |
| 2009/0250769 A1 * | 10/2009 | Yu et al. | ...... | 257/397 |
| 2009/0273011 A1 * | 11/2009 | Bjoerk et al. | ...... | 257/288 |
| 2010/0200933 A1 * | 8/2010 | Kahng et al. | ...... | 257/401 |

* cited by examiner

*Primary Examiner* — Victor A Mandala
(74) *Attorney, Agent, or Firm* — Rahul D. Engineer (57) ABSTRACT

A trigate device having an extended metal gate electrode comprises a semiconductor body having a top surface and opposing sidewalls formed on a substrate, an isolation layer formed on the substrate and around the semiconductor body, wherein a portion of the semiconductor body remains exposed above the isolation layer, and a gate stack formed on the top surface and opposing sidewalls of the semiconductor body, wherein the gate stack extends a depth into the isolation layer, thereby causing a bottom surface of the gate stack to be below a top surface of the isolation layer.

12 Claims, 6 Drawing Sheets

TRIGATE TRANSISTOR HAVING EXTENDED METAL GATE ELECTRODE

BACKGROUND

Short channel effects (SCE) produced in channel regions positioned under the gate of a transistor give rise to high threshold voltages Vt and result in reduced drive current at identical off current. Trigate devices have lower Vt due to the gate wrapping around on three sides of the fin's gate region improving its SCE. However, the bottom ungated region of the fin can contribute to SCE if the peak of the source/drain tip junction reaches below the plane of the gated region. There is a need, therefore, to mitigate short channel effects in a trigate device typically manufactured on bulk silicon.

DETAILED DESCRIPTION

Described herein are systems and methods of forming frigate transistors having extended gate dielectric layers and extended gate electrode layers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention provide a novel nonplanar transistor having an extended gate dielectric layer and an extended metal gate electrode. A nonplanar device includes a semiconductor body having a top surface and laterally opposite sidewalls formed on a substrate. A gate dielectric is formed on the top surface and on the sidewalls of the channel region of the semiconductor body. A metal gate electrode is then formed around the semiconductor body so that it covers the top surface and two sidewalls of the semiconductor body. As shown below, in accordance with implementations of the invention, portions of the gate dielectric layer and gate electrode formed on the sidewalls of the channel region extend below the channel region of the semiconductor body.

Since the gate electrode covers the semiconductor body on three sides the transistor essentially has three gate electrodes, one on the top of the semiconductor body and one on each of the sidewalls of the semiconductor body. Such a nonplanar transistor can be referred to as a trigate transistor since it has three gate electrodes. Since the channel region of the semiconductor body is covered by the gate electrode on three sides, the electrical field provided by the gate electrode can fully deplete the channel region of the device, providing advantageous electrical characteristics such as increased drive current as well as low leakage current. And since the gate electrode formed in accordance with the invention extends below the channel region of the semiconductor body, even if the peak of the source/drain tip regions are at or below the gated region, short channel effects are reduced or mitigated without going to a silicon-on-insulator (SOI) technology. Further, the reduction in the threshold voltage improves drive current at identical off-current.

In accordance with implementations of the invention, a trigate transistor with a metal gate electrode may be fabricated with a replacement metal gate approach. A replacement gate technique allows different metal films to be used for the gate electrodes for the PMOS and NMOS transistors. In this way, the PMOS device can have a gate electrode with a work function that is tailored for the PMOS device and the NMOS transistor can have a gate electrode with a work function tailored for the NMOS device, allowing both the NMOS and PMOS electrical characteristics and performance to be optimized. A replacement metal gate process also ensures that the metal layers go through few and low temperature thermal cycles making them more stable and reliable. In a replacement gate technique a sacrificial polysilicon gate electrode is formed over the semiconductor body. Standard source and drain doping and formation techniques including sidewall spacers can then be formed. A dielectric layer is then blanket deposited over the sacrificial polysilicon gate electrode and the semiconductor body. The dielectric layer is polished back to expose the top surface of the gate electrode. The sacrificial gate electrode can then be removed to form a trench or opening which defines where the gate electrode is to be formed. This may be done for either the NMOS first, PMOS last, or the PMOS first, NMOS last, or the NMOS and PMOS together. The selectivity is achieved by masking off the device on which the gate electrode is not being formed. For the gate electrode deposition process, first a dielectric layer is grown over the semiconductor. Then a metal film is blanket deposited over the insulating layer and into the trench and over the semiconductor body in the trench. The metal film is then polished back to form the gate electrode for the device. The process is repeated for the complementary device while masking off the other device.

Figure 1:
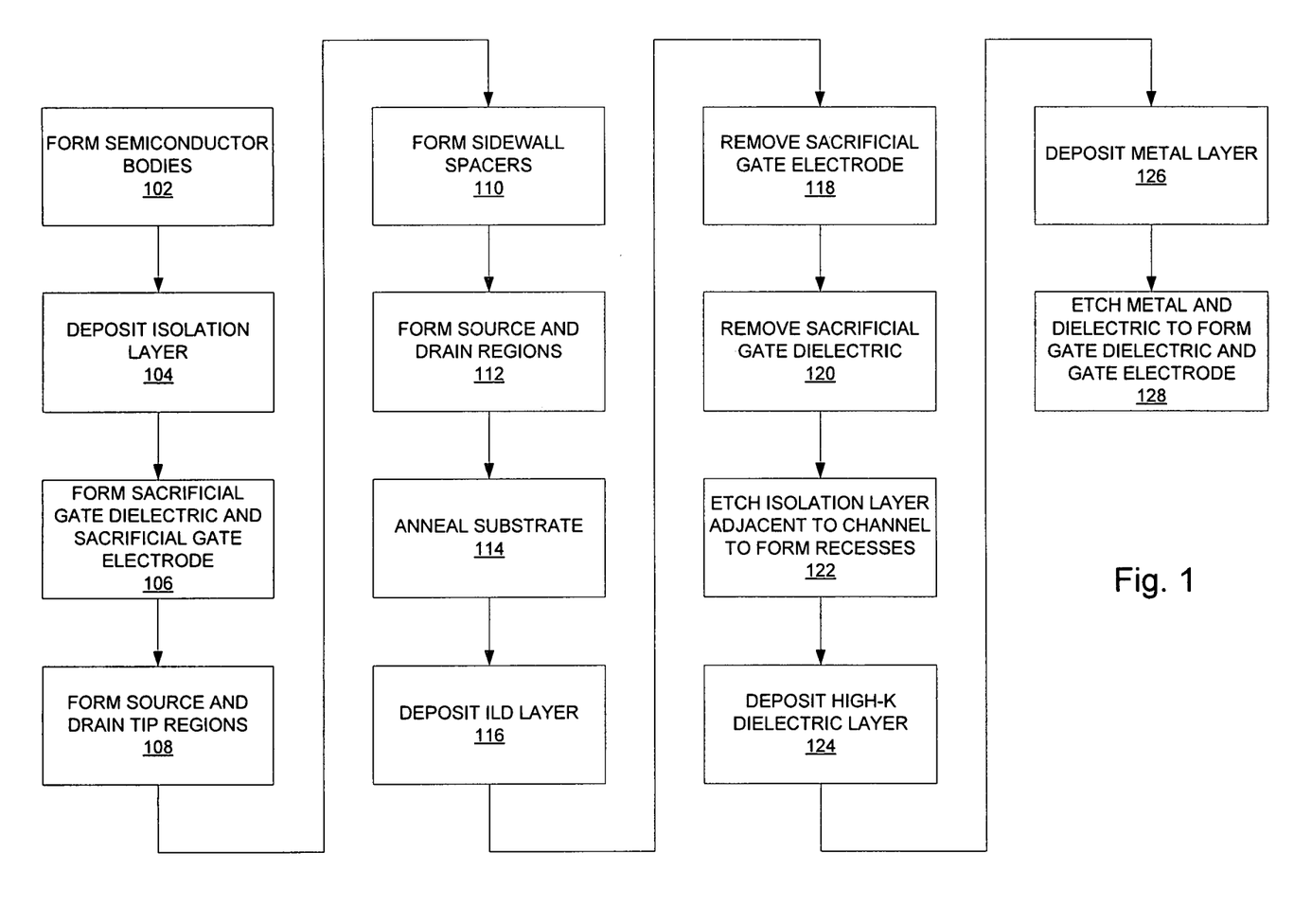
FIG. 1 is a method of forming a trigate device in accordance with an implementation of the invention.

FIG. 1 is a method 100 of forming a complementary metal-oxide-semiconductor (CMOS) device that includes a P-type device (PMOS) and an N-type device (NMOS). An NMOS device is a transistor where the carriers are electrons and a PMOS device is a transistor where the carriers are holes. The NMOS device and the PMOS device are coupled together through higher levels of metallization into a functional CMOS circuit. Although, a CMOS integrated circuit is described herein, the present invention is not limited to a CMOS integrated circuit and can include circuits which include only PMOS or only NMOS devices. FIGS. 2 through 12 illustrate structures that are formed when the method 100 of FIG. 1 is carried out.

Turning to FIG. 1, the method 100 begins with the formation of a semiconductor body for the NMOS device and a semiconductor body for the PMOS device (process 102 of FIG. 1). In some implementations, the semiconductor bodies may be formed by patterning a top surface of a semiconductor substrate to form a plurality of semiconductor fins. The semiconductor substrate may be a crystalline substrate that may be formed using a bulk silicon substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, or gallium antimonide. Although a few examples of materials from which the substrate may be formed are described here, any material that may serve as a foundation upon which a semiconductor device may be built falls within the spirit and scope of the present invention.

Figure 2:
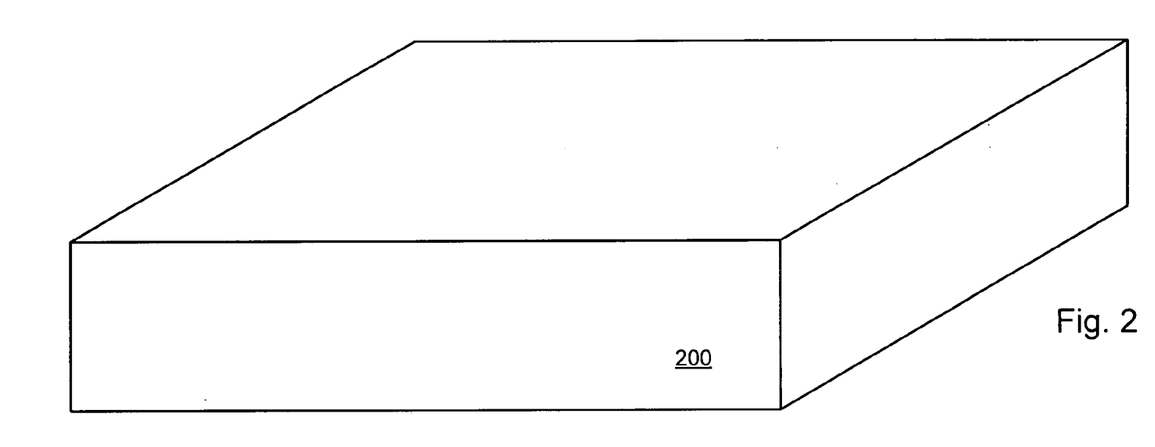
FIGS. 2 through 12 illustrate structures that are formed when the method of FIG. 1 is carried out.
Figure 3:
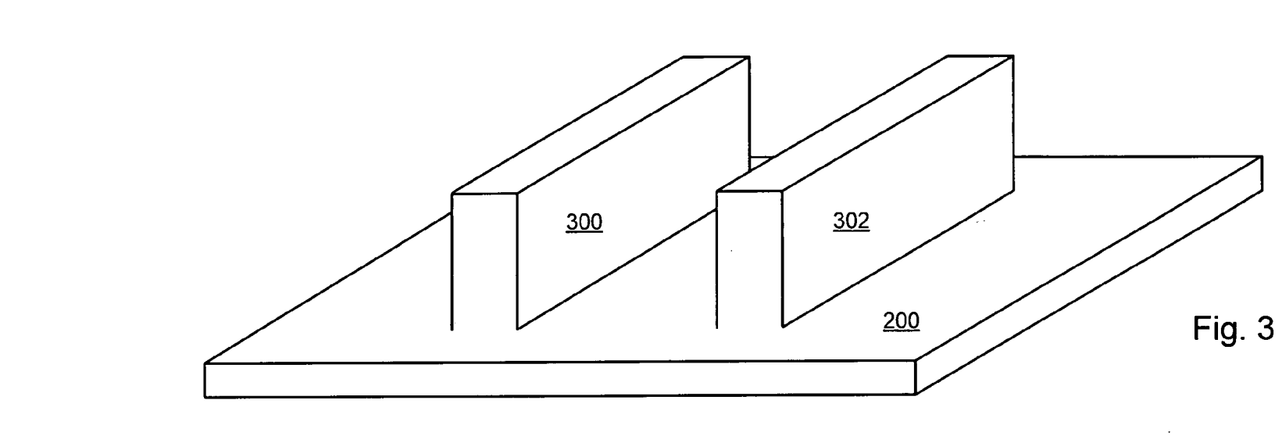

FIG. 2 illustrates a semiconductor substrate 200. FIG. 3 illustrates a pair of semiconductor bodies (or fins) 300 and 302 formed out of the substrate 200. As shown, the semiconductor bodies 300 and 302 are formed out of the substrate 200 and are therefore physically coupled to the substrate 200.

After the patterning of a semiconductor film to form the semiconductor fins, a shallow trench isolation layer may be deposited between adjacent fins to electrically isolate them from each other (process 104 of FIG. 1). The shallow trench isolation layer may be formed using any material known for use in isolation structures for integrated circuit applications, such as a nitride or an oxide. The isolation layer may be deposited on the substrate by way of at least one of thermal oxidation, chemical vapor deposition, plasma vapor deposition, plasma sputtering, atomic layer deposition, and evaporation.

Figure 4:
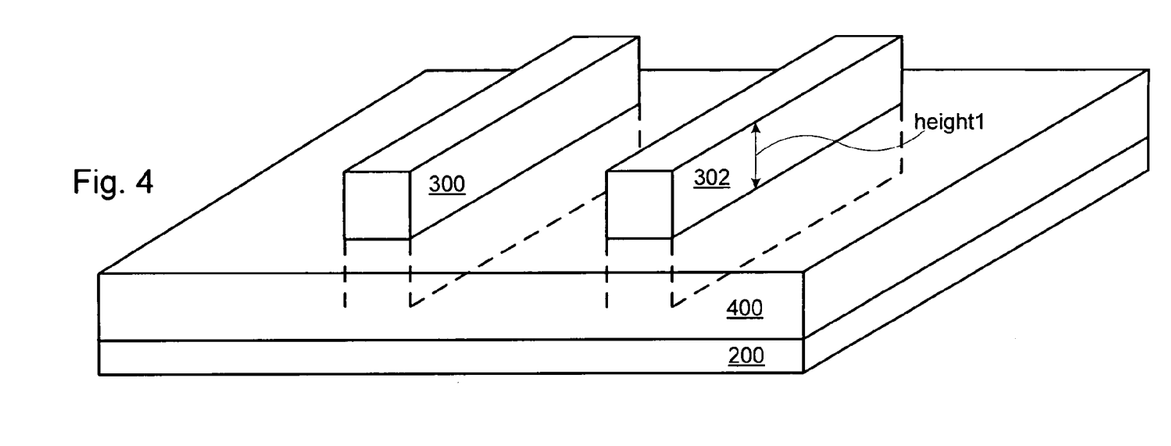

FIG. 4 illustrates a shallow trench isolation layer 400 that has been deposited around the semiconductor bodies 300 and 302 on the substrate 200. The buried portions of the semiconductor bodies 300 and 302 are represented by the dashed lines. After deposition of the isolation layer 400, a first height of the semiconductor bodies 300 and 302 remains exposed above the isolation layer 400. This first height of the semiconductor bodies 300 and 302 above the isolation layer 400 is referenced herein as "height1".

Figure 5:
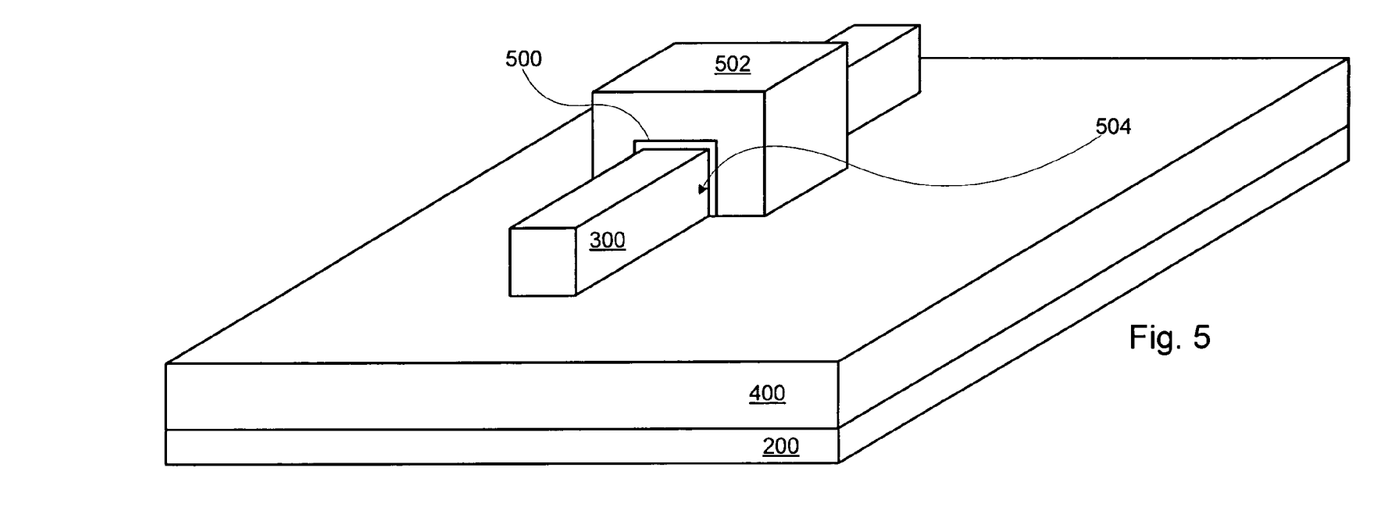

Next, a sacrificial gate dielectric layer and a sacrificial polysilicon gate electrode are formed on the top surface and on or adjacent to the sidewalls of the silicon bodies (process 106 of FIG. 1). This is shown in FIG. 5, which illustrates a sacrificial gate dielectric 500 and a sacrificial gate electrode 502 formed on the top and sidewalls of the semiconductor body 300. For clarity, semiconductor body 302 is not shown in the remaining figures. It should be noted, however, that the processes shown in FIGS. 5 through 12 are applied to semiconductor body 302 as well.

To form the sacrificial gate dielectric 500 and the sacrificial gate electrode 502, first a sacrificial gate dielectric layer is formed on the top surface and adjacent to the sidewalls of the semiconductor body 300. The sacrificial gate dielectric layer is ideally formed from a material which will not substantially etch during the removal or etching of the sacrificial gate electrode material in a subsequent process, thereby allowing the sacrificial gate dielectric layer to protect the underlying semiconductor body when the sacrificial gate electrode is removed. This is especially important when the sacrificial gate electrode material and semiconductor body are formed from the same material, such as silicon. In an implementation of the invention, the sacrificial gate dielectric is an oxide, such as silicon dioxide formed to a thickness between 10 Å and 30 Å. If the sacrificial gate dielectric is grown, it will form only on the exposed surfaces of the semiconductor body 300 and not on the isolation layer 400. If the sacrificial gate dielectric is a deposited blanket layer, it will be blanket deposited onto the isolation layer 400 as well as the semiconductor body 300.

Next, a sacrificial gate electrode material is blanket deposited over the sacrificial gate dielectric, including on the top surface and adjacent to the sidewalls of the semiconductor body. The sacrificial gate electrode material is deposited to a thickness desired for the height of the subsequently formed gate electrodes for the nonplanar devices. The sacrificial gate electrode material and the sacrificial gate dielectric are then patterned by well known techniques, such as photolithography and etching to form the sacrificial gate electrode 502 and sacrificial gate dielectric 500 as shown in FIG. 5. The sacrificial gate electrode 502 is patterned into the same shape and at the same location where the subsequently formed actual gate electrode is desired. As shown, the sacrificial gate electrode 502 has a pair of laterally opposite sidewalls 502a and 502b separated by a distance which defines the gate length of the frigate device. In an implementation of the invention, the laterally opposite sidewalls 502a and 502b of the sacrificial gate electrode 502 run in a direction perpendicular to laterally opposite sidewalls of the semiconductor body 300. In an implementation of the invention, the sacrificial film is a polycrystalline silicon film. In other implementations of the invention, the sacrificial film is monocrystalline silicon film or an epitaxial silicon film.

If desired, source and drain tip regions, also known as extension regions, may be formed in the semiconductor body (process 108). The source and drain extension regions may be formed by doping the semiconductor body 300 on opposites sides of the sacrificial gate electrode 502 with impurities that are well known in the art, such as boron atoms for P-type regions and arsenic or phosphorous atoms for N-type regions. In an embodiment of the present invention, the tip regions are formed utilizing well known ion implantation techniques. Processes used for forming source and drain tip regions are well known in the art and will not be described herein. FIG. 5 illustrates where one of the tip regions 504 may be formed adjacent to sacrificial gate electrode 502 and the sacrificial gate dielectric 500.

Figure 6:
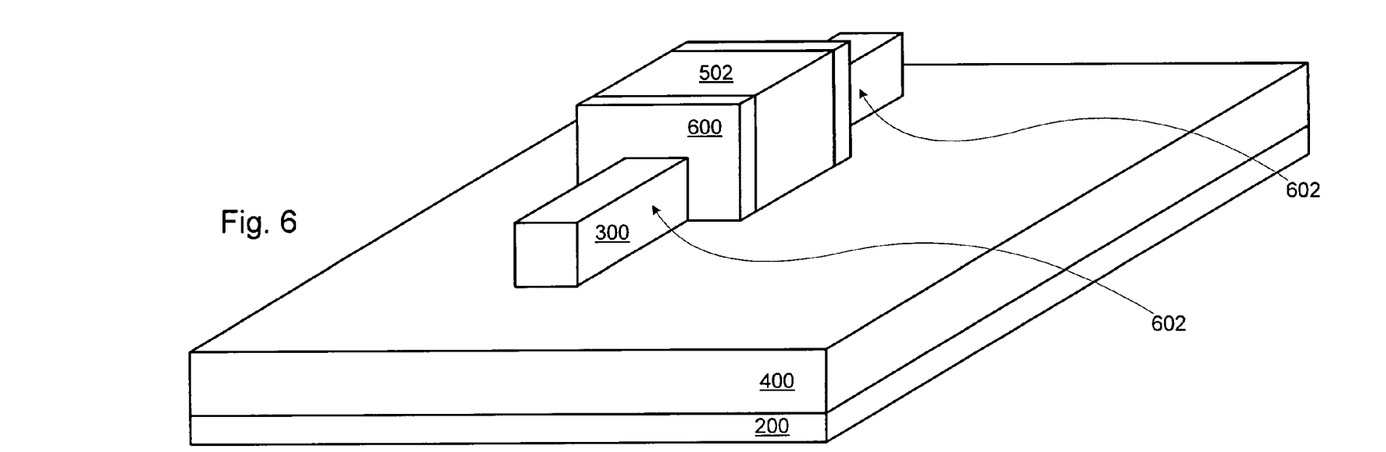

Next, sidewall spacers can be formed adjacent to the sacrificial gate structures of the trigate transistors (process 110). This is shown in FIG. 6, where sidewall spacers 600 are formed along opposite sidewalls of the sacrificial gate electrode 502. The sidewall spacers 600 may be formed by any well known techniques, such as by blanket depositing the conformal sidewall spacer material over the substrate including the top surface and sidewalls of the sacrificial gate electrode 502, as well as on the top surface and sidewalls of semiconductor body 300. The spacer material is deposited to a thickness which is approximately equal to the width desired for the spacers 600. In an implementation of the invention, the spacer material is deposited to a thickness between 20 Å and 200 Å. The spacer material can be a dielectric, such as silicon nitride, silicon oxide, silicon oxynitride or combinations thereof. In an implementation of the invention, the spacer material is silicon nitride formed by a hot wall low-pressure chemical vapor deposition (LPCVD) process. The spacer material is then anisotropically etched back to remove the spacer material from areas where it is not desired (e.g., top surfaces of the sacrificial gate electrode 502, semiconductor body 300, and isolation layer 400) while leaving spacer material on the sidewalls of the sacrificial gate electrode 502, thereby forming sidewall spacers 600. In alternate implementations, a photolithography process may be employed to appropriately etch the sidewall spacers.

In some implementations, by making the height of the sacrificial gate electrodes sufficiently taller (e.g., 3x) then the thickness of the height of the semiconductor body, the anisotropic etch back can be used to remove the spacer material from the sidewalls of the semiconductor body 300 while leaving sufficient spacer material to provide sidewall spacers 600 adjacent to the sacrificial gate electrode 502.

At this time, if desired, additional silicon can be formed onto the exposed top surface and sidewalls of the semiconductor body 300 in order to form raised source and drain regions. The additional silicon, such as epitaxial silicon, can be formed on the exposed surface of the semiconductor body 300 utilizing well known selective deposition process. A selective silicon deposition process will deposit silicon, such as epitaxial silicon onto silicon containing regions, such as silicon body 300 and will not deposit silicon onto non-silicon containing areas, such as sidewall spacers 600.

Source and drain regions may then be formed in the semiconductor body 300 on opposite sides of the sacrificial gate electrode 502 (process 112). In an implementation of the invention, the source and drain regions are formed by ion implantation. The sacrificial gate electrode 502 masks the channel region of the device from being doped with P-type or N-type impurities during the source and drain implantation processes. Additionally, the sidewall spacers 600 prevent the underlying previously formed source and drain tip regions in the semiconductor body 300 from being doped by the source and drain dopants. Again, P-type dopants include boron and N-type impurities include arsenic or phosphorous atoms. FIG. 6 illustrates where source and drain regions 602 may be formed in the semiconductor body 300.

Next, the substrate is annealed to activate the dopants placed in the semiconductor body 300 (process 114). That is, the substrate is now annealed to a temperature and for a time sufficient to cause the N-type or P-type dopants in semiconductor body 300 to move from interstitial sites and substitute with atoms in the lattice to form N-type or P-type source and drain regions 602 in the semiconductor body 300.

Next, an interlayer dielectric (ILD) material is blanket deposited over the substrate to cover all of the exposed surfaces (process 116). The ILD layer is formed to a thickness sufficient to completely cover the exposed surfaces including sacrificial gate electrode 502. The ILD is formed of a material whereby the sacrificial gate electrode 502 can be removed without significantly etching away the dielectric layer. After blanket depositing the ILD, the ILD is planarized, such as by chemical mechanical planarization, until the top surface of the dielectric material is planar with the sacrificial gate electrode 502 and the top surface of the sacrificial gate electrode 502 is exposed. For clarity, the ILD is not illustrated in the accompanying figures.

In various implementations of the invention, the ILD may be formed using materials known for the applicability in dielectric layers for integrated circuit structures, such as low-k dielectric materials. Such dielectric materials include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer may include pores or other voids to further reduce its dielectric constant.

Figure 7:
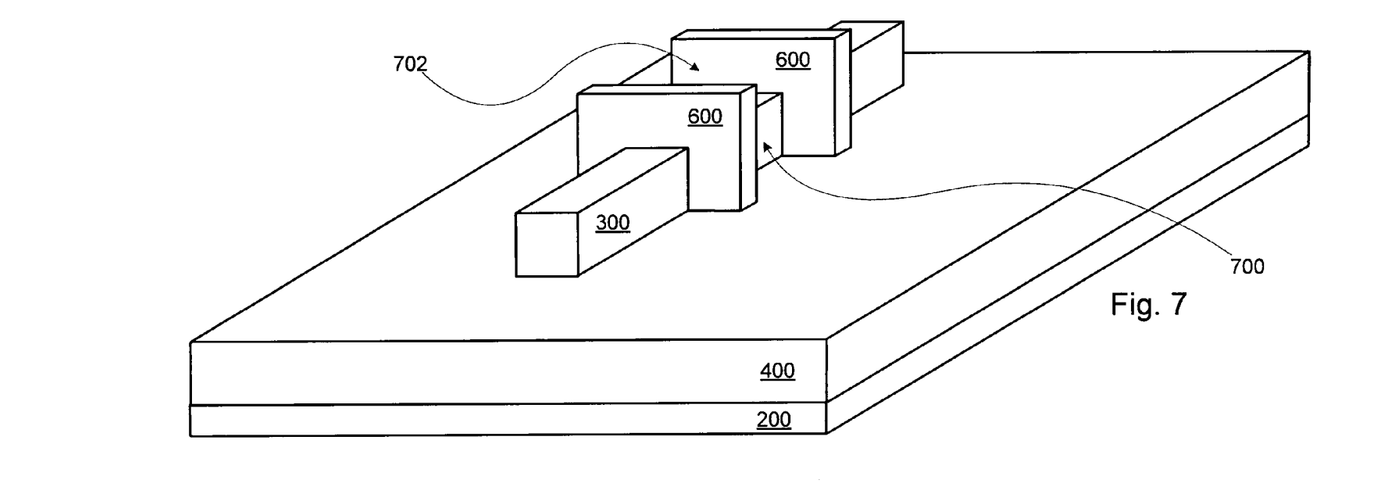

Next, the sacrificial gate electrode 502 is removed (process 118) while other regions are masked off. The sacrificial gate electrode 502 may be removed using techniques known in the art such as wet etching. After the sacrificial gate electrode 502 is removed, the sacrificial gate dielectric layer 500 is also removed (process 120). Removing the sacrificial gate electrode 502 and the sacrificial gate dielectric layer 500 exposes a channel region 700 of the semiconductor body 300 as shown in FIG. 7. The portion of semiconductor body 300 located between the source and drain regions 602 defines the channel region 700 of the trigate device. The channel region 700 can also be defined as the area of the semiconductor body 300 surrounded by the gate electrode. A portion of the isolation layer 400 adjacent to the channel region 700 is exposed as well. Removal of the sacrificial gate electrode 502 forms an opening 702 where the final gate dielectric and the final gate electrode for the NMOS or PMOS device will be formed.

In implementations of the invention, the wet etchant used may be a metallic hydroxide, such as but not limited to potassium hydroxide (KOH) or ammonium hydroxide ($NH_4OH$). In some implementations, megasonic or ultrasonic energy may be applied. Once the sacrificial gate electrode 502 has been removed, the etchant stops on the sacrificial gate dielectric layer 500. In an implementation of the invention, the sacrificial gate dielectric layer 500 is an oxide that may be removed with an etchant such as, but not limited to, aqueous hydrofluoric acid.

As described above, one issue with trigate devices is that the bottom ungated region of the device can give rise to short channel effect (SCE) issues if the peak of the source or drain tip junction is at or below the plane of the gated region. To mitigate this issue, in accordance with implementations of the invention, portions of the isolation layer adjacent to the channel region are recessed to enable the gate electrode to be extended below the original channel region and below the source and drain tip regions. This causes a height of the semiconductor body 300 above the isolation layer 400 at the channel region 700 to be larger than a height of the semiconductor body 300 above the isolation layer 400 at the source and drain regions 602 (i.e., "height1").

As mentioned above, removing the sacrificial gate electrode 502 and the sacrificial gate dielectric layer 500 exposes portions of the isolation layer 400 adjacent to the channel region 700. These exposed portions of the isolation layer 400 on both sides of the channel region 700 are then etched using an etching process that removes the isolation layer material while being selective to the semiconductor body (process 122). In implementations of the invention, the etching process is carried out until the isolation layer is recessed about 1 nm to 5 nm.

Figure 8:
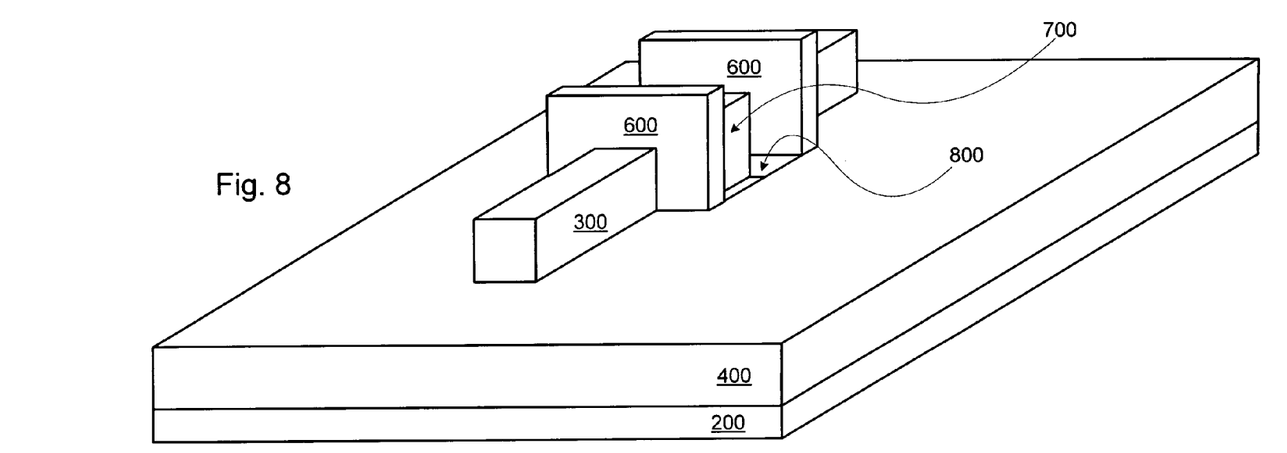
Figure 9:
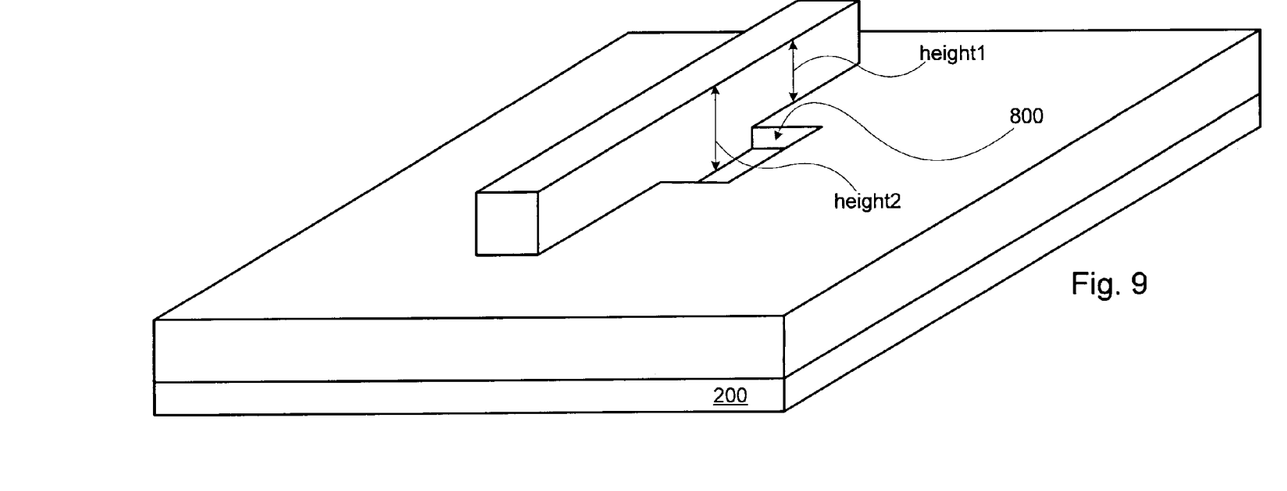

FIG. 8 illustrates a recessed portion 800 of the isolation layer 400 that is adjacent to the channel region 700 of the semiconductor body 300. A similar recessed portion exists on the opposite side of the semiconductor body 300 but cannot be seen in FIG. 8. The recessed portion 800 is bordered by the sidewall spacers 600. For clarity, FIG. 9 removes the sidewall spacers 600 to better illustrate the recessed portion 800. As shown in FIG. 9, the height of the semiconductor body 300 at the source and drain regions is equal to "height1" while the height of the semiconductor body 300 at the channel region is equal to "height2" due to the recessed portion 800. The value of "height2" is greater than the value of height1".

The recessed portion 800 of the isolation layer 400 that is adjacent to the channel region 700 permits the subsequently formed gate electrode to extend down over a greater height of the semiconductor body 300 in the channel region 700, thereby providing a greater amount of control over the conductivity of the channel region 700 between the source and drain regions 602. This may reduce short channel effects (SCE) for channel conductivity, and may thereby reduce power dissipation.

As noted above, the recessed portion 800 of the isolation layer 400 may have a depth of approximately 1 nm to 5 nm. In some implementations, recessing the isolation layer 400 by less than the 1 nm may result in less improvement in reducing SCE. In other implementations, recessing the isolation layer 400 by more than 5 nm may add more gate capacitance and increase the switching delay between the source and drain regions 602.

Figure 10:
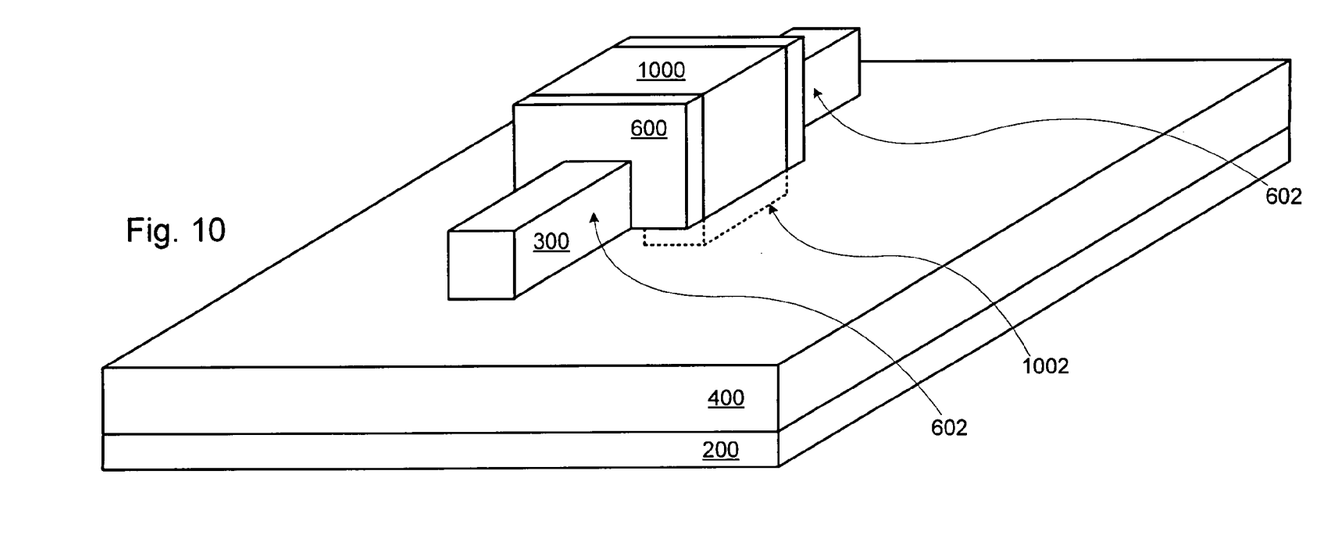

Finally, a gate stack that includes a replacement gate dielectric layer and a replacement metal gate electrode for the NMOS or PMOS device may be formed on the channel region 700 that extends down into the recessed portion 800. This is shown in FIG. 10, where a new gate dielectric layer and a new metal gate electrode 1000 are formed in the opening 702. As shown, a portion 1002 of the metal gate electrode 1000 extends down into the isolation layer 400 by way of the recessed portion 800. As such, the plane of the gated region is now below the peak of the source or drain tip junctions, thereby mitigating SCE issues.

The new gate dielectric layer (shown in FIG. 11) is formed by conformally depositing a blanket layer of high-k material over the substrate, thereby covering the top surface and sidewalls of the channel region 700 (process 124). The gate dielectric material can be formed by any well known process, such as a thermal oxidation process, a chemical vapor deposition process, an atomic layer deposition process, to name a few. Materials that may be used to form the gate dielectric layer include high-k dielectric materials that include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Next, a metal gate electrode material for either an NMOS or PMOS device is blanket deposited over the gate dielectric layer (process 126). The gate electrode material may be any well known gate electrode material. If an NMOS is being formed, the metal used for the gate electrode may be an n-type workfunction metal that has a workfunction between about 3.7 eV and about 4.4 eV. N-type materials that may be used include hafnium, zirconium, titanium, tantalum, aluminum, and metal carbides that include these elements, i.e., titanium carbide, zirconium carbide, tantalum carbide, hafnium carbide and aluminum carbide. If a PMOS is being formed, the metal used for the gate electrode may be a p-type workfunction metal that has a workfunction between about 4.7 eV and about 5.3 eV. P-type materials that may be used include ruthenium, palladium, platinum, cobalt, nickel, and conductive metal oxides, e.g., ruthenium oxide.

The gate electrode material and gate dielectric material are then planarized and removed from the top of the ILD layer (process 128). The end result is a metal gate electrode 1000 and a high-k gate dielectric layer for the NMOS or PMOS trigate device. The metal gate electrode 1000 has a pair of laterally opposite sidewalls separated by a distance which defines the gate length of the frigate device. In an implementation of the invention, the laterally opposite sidewalls of the metal gate electrode 1000 run in a direction perpendicular to laterally opposite sidewalls of the semiconductor body 300. By providing a gate dielectric layer and a metal gate electrode 1000 which surround the semiconductor body 300 (namely the channel region 700) on three sides, the NMOS or PMOS device is characterized as having three channels and three gates, thereby forming a trigate device.

As will be appreciated by those of skill in the art, the metal gate electrode may be formed be depositing two or more metal layers, such as a workfunction metal and a fill metal. In some implementations, the metal gate electrode may be formed from the same film or a composite stack of films. In some implementations, the metal gate electrode may have a midgap work function or a work function between an NMOS and a PMOS, such as a midgap work function between 4.3 eV and 4.7 eV. Also, in further implementations of the invention, a CMOS fabrication process will apply the above detailed processes of the invention to two adjacent semiconductor bodies, thereby forming complementary PMOS and NMOS transistors.

Figure 11:
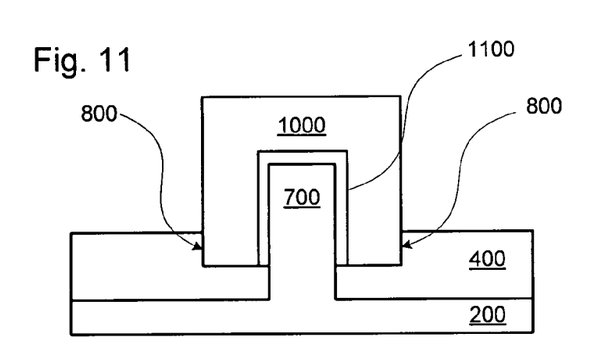
Figure 12:
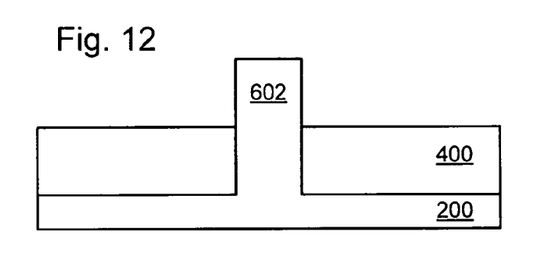

FIGS. 11 and 12 are cross-section illustrations of the semiconductor body. FIG. 11 illustrates a cross-section taken within the channel region 700 of the semiconductor body 300. The metal gate electrode 1000 and a high-k gate dielectric layer 1100 are shown as being formed on three sides of the channel region 700. The metal gate electrode 1000 and the high-k gate dielectric layer 1100 extend down into the isolation layer 400 due to recess 800. Thus, the peaks of the source/drain tip regions that are blocked by the isolation layer 400 will not reach below the recessed gate electrode 1000. FIG. 12 illustrates a cross-section taken within one of the source/drain regions 602 of the semiconductor body 300. Since this portion of the structure is not adjacent to the channel region 700, there is no recess shown in the isolation layer 400. As shown, the height of the semiconductor body 300 above the isolation layer 400 at the channel region 700 is larger than the height of the semiconductor body 300 above the isolation layer 400 at the source and drain regions 602.

Accordingly, a trigate device has been demonstrated that includes an extended metal gate electrode. The metal gate electrode of the invention extends down into the isolation layer, due to a recess that is formed in the isolation layer, to provide a gated region that fully encompasses the source and drain tip regions. The peak of the source and drain tip junctions are no longer at or below the gated region, therefore, the bottom ungated region will no longer give rise to short channel effect issues.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
 a semiconductor body having a top surface and opposing sidewalls formed on a substrate;
 an isolation layer formed on the substrate and around the semiconductor body, wherein a portion of the semiconductor body remains exposed above the isolation layer; and
 a gate stack formed on the top surface and opposing sidewalls of the semiconductor body, wherein the gate stack extends a depth of between 1 nm and 5 nm into the isolation layer, thereby causing a bottom surface of the gate stack to be below a top surface of the isolation layer.

2. The apparatus of claim 1, wherein the semiconductor body is formed on a bulk silicon substrate.

3. The apparatus of claim 1, wherein the gate stack comprises a gate dielectric layer and a gate electrode layer.

4. The apparatus of claim 3, wherein the gate dielectric layer is a high-k dielectric layer and the gate electrode layer is a metal gate electrode layer.

5. An apparatus comprising:
 a semiconductor body having a top surface and opposing sidewalls formed on a substrate;

an isolation layer formed on the substrate and around the semiconductor body, wherein a portion of the semiconductor body remains exposed above the isolation layer;

a gate stack formed on a top surface and sidewalls of the semiconductor body;

a pair of sidewall spacers formed adjacent to the gate stack;

a source tip region and drain tip region formed below the sidewall spacers; and a source region and a drain region formed in the semiconductor body on opposite sides of the gate electrode;

wherein the portions of the gate stack formed on the sidewalls of the semiconductor body extend between 1 nm and 5 nm into the isolation layer.

6. The apparatus of claim 5, wherein the semiconductor body is formed on a bulk silicon substrate.

7. The apparatus of claim 5, wherein the gate stack comprises a gate dielectric layer and a gate electrode layer.

8. The apparatus of claim 7, wherein the gate dielectric layer is a high-k dielectric layer and the gate electrode layer is a metal gate electrode layer.

9. An apparatus comprising:

a semiconductor body having a top surface and opposing sidewalls formed on a substrate, the semiconductor body having a source region, a drain region, and a channel region;

an isolation layer formed on the substrate and around the semiconductor body, wherein a thickness of the isolation layer adjacent to the channel region is between 1 nm and 5 nm less than less than a thickness of the isolation layer adjacent to the source and drain regions; and a gate stack formed on the top surface and sidewalls of the channel region of the semiconductor body, wherein the smaller thickness of the isolation layer adjacent to the channel region causes the gate stack to extend down past a bottom of the channel region.

10. The apparatus of claim 9, wherein the semiconductor body is formed on a bulk silicon substrate.

11. The apparatus of claim 9, wherein the gate stack comprises a gate dielectric layer and a gate electrode layer.

12. The apparatus of claim 11, wherein the gate dielectric layer is a high-k dielectric layer and the gate electrode layer is a metal gate electrode layer.

* * * * *